(12) United States Patent
Kondo

(10) Patent No.: US 10,188,020 B2
(45) Date of Patent: Jan. 22, 2019

(54) CABLE ASSEMBLY AND CABLE ASSEMBLY MANUFACTURING METHOD

(71) Applicant: HOSIDEN CORPORATION, Yao-shi, Osaka (JP)

(72) Inventor: Hayato Kondo, Yao (JP)

(73) Assignee: Hosiden Corporation, Yao-Shi, Osaka (JP)

( * ) Notice: Subject to any disclaimer, the term of this patent is extended or adjusted under 35 U.S.C. 154(b) by 0 days.

(21) Appl. No.: 15/529,761

(22) PCT Filed: Nov. 11, 2015

(86) PCT No.: PCT/JP2015/081744
§ 371 (c)(1),
(2) Date: May 25, 2017

(87) PCT Pub. No.: WO2016/093012
PCT Pub. Date: Jun. 16, 2016

(65) Prior Publication Data
US 2017/0332525 A1 Nov. 16, 2017

(30) Foreign Application Priority Data
Dec. 9, 2014 (JP) .................. 2014-249252

(51) Int. Cl.
*H01B 11/00* (2006.01)
*H01B 13/26* (2006.01)
(Continued)

(52) U.S. Cl.
CPC ............ *H05K 9/0098* (2013.01); *H01B 7/00* (2013.01); *H01B 7/17* (2013.01); *H01B 11/002* (2013.01);
(Continued)

(58) Field of Classification Search
CPC ...... H01B 11/002; H01B 11/06; H01B 13/00; H01B 13/26; H01B 7/00; H01B 7/17;
(Continued)

(56) References Cited

U.S. PATENT DOCUMENTS 6,285,079 B1 * 9/2001 Kunikiyo ............ H01L 23/3114
257/737
6,790,051 B1 * 9/2004 Secall ................ H01R 13/5202
174/260
(Continued)

FOREIGN PATENT DOCUMENTS

JP 2002135938 A 5/2002
JP 2004071404 A 3/2004
(Continued)

OTHER PUBLICATIONS

International Search Report (Form PCT/ISA/210) for International Patent Application No. PCT/JP2015/081744, issued from the Japan Patent Office, dated Jan. 26, 2016, 5 pages.
(Continued)

*Primary Examiner* — Timothy J Thompson
*Assistant Examiner* — Guillermo J Egoavil
(74) *Attorney, Agent, or Firm* — Kilyk & Bowersox, P.L.L.C.

(57) ABSTRACT

[Problem] Objects of the invention are to provide a cable assembly with reduced characteristic impedance at a protruding end portion of a first wire of a cable and configured for easy manufacture, and to provide a method for manufacturing the cable assembly.
[Configuration] A cable assembly A1 includes a terminal 400*a*, a cable 100, and an electroconductive member 200. The cable 100 includes an outer insulator 100, a shield conductor 120 inside the outer insulator 110, and at least one first wire 130*a* being a signal wire inside the shield conduc-
(Continued)

tor 120. The first wire 130*a* includes a protruding portion Pa protruding in the Y-Y' direction from the shield conductor 120 and the outer insulator 110. The electroconductive member 200 is an electroconductive plate or electroconductive tape wound around at least a part in the Y-Y' direction of the protruding portion Pa.

22 Claims, 10 Drawing Sheets

(51) Int. Cl.

| | | |
|---|---|---|
| *H05K 1/02* | (2006.01) | |
| *H05K 9/00* | (2006.01) | |
| *H05K 3/32* | (2006.01) | |
| *H01B 7/00* | (2006.01) | |
| *H01B 7/17* | (2006.01) | |
| *H01B 11/06* | (2006.01) | |
| *H01B 13/00* | (2006.01) | |
| *H01R 13/6473* | (2011.01) | |
| *H01R 13/6592* | (2011.01) | |

(52) U.S. Cl.
CPC ............ *H01B 11/06* (2013.01); *H01B 13/00* (2013.01); *H01B 13/26* (2013.01); *H01R 13/6473* (2013.01); *H05K 1/0237* (2013.01); *H05K 3/32* (2013.01); *H05K 9/00* (2013.01); *H01R 13/6592* (2013.01)

(58) Field of Classification Search
CPC .. H01B 7/0045; H01B 11/00; H01R 13/6463; H01R 13/6473; H01R 9/035; H01R 13/6589; H01R 13/6592; H05K 1/0237; H05K 3/32; H05K 9/00; H05K 9/0098; H05K 1/02
USPC ........................... 174/250, 72 A; 439/607.01
See application file for complete search history.

(56) References Cited

U.S. PATENT DOCUMENTS

| | | | |
|---|---|---|---|
| 2002/0050386 A1 | 5/2002 | Aizawa | |
| 2005/0221663 A1 | 10/2005 | Matsumoto | |
| 2010/0035449 A1* | 2/2010 | Nagafuchi | H01R 4/18 |
| | | | 439/98 |
| 2011/0300750 A1* | 12/2011 | Nagawatari | H01R 9/035 |
| | | | 439/607.01 |
| 2014/0353029 A1* | 12/2014 | Tsubouchi | H01R 13/6463 |
| | | | 174/72 A |
| 2015/0131253 A1* | 5/2015 | Park | H01G 2/06 |
| | | | 361/782 |
| 2016/0211074 A1* | 7/2016 | Gu | H01G 2/065 |
| 2017/0250026 A1* | 8/2017 | Mizuno | H01G 4/012 |

FOREIGN PATENT DOCUMENTS

| | | |
|---|---|---|
| JP | 2005038617 A | 2/2005 |
| JP | 2005294174 A | 10/2005 |
| JP | 2013069509 A | 4/2013 |
| JP | 2014045016 A | 3/2014 |
| WO | 2013006592 A2 | 1/2013 |

OTHER PUBLICATIONS

Written Opinion of the International Searching Authority (Form PCT/ISA/237) for International Patent Application No. PCT/JP2015/081744, issued from the Japan Patent Office, dated Jan. 18, 2016, 4 pages.

Extended European Search Report for Application No. EP 15868092.6 published by the European Patent Office (EPO), dated Nov. 14, 2017, including corresponding Communication, Annex, Information on Search Strategy, and 5-page EPO Form 1703.

\* cited by examiner

CABLE ASSEMBLY AND CABLE ASSEMBLY MANUFACTURING METHOD

TECHNICAL FIELD

The invention relates to cable assemblies and methods for manufacturing the cable assemblies.

BACKGROUND ART

A common composite cable has a tuboid outer insulator, a shield conductor inside the outer insulator, and a plurality of signal wires inside the shield conductor. Before connecting the core wires of the signal wires of the composite cable to respective terminals of a connector or other device, an end portion of the outer insulator and an end portion of the shield conductor of the composite cable are cut away such that an end portion of the signal wire protrudes from the outer insulator and the shield conductor. The protruding end portion of each signal wire has a higher impedance than that of a portion of the signal wire that is located inside the shield conductor and the outer insulator (hereinafter referred to as an inner portion). In other words, there is an impedance mismatch in each signal wire between its end portion and the inner portion.

Patent Literature 1 identified below discloses a first cable assembly which may resolve impedance mismatch in a signal wire as described above. Patent Literature 2 identified below discloses a second cable assembly which may resolve impedance mismatch in a signal wire as described above. The first cable assembly includes a composite cable, a circuit board, a heat-shrinkable tube being an insulator. The composite cable includes two signal wires for differential transmission, a drain wire, and a shield conductor. The signal and drain wires are disposed inside the tuboid shield conductor. A lengthwise end portion of the shield conductor is cut away such as to protrude end portions of the signal wires and the drain wire from the shield conductor. The protruding end portions of the signal and drain wires are respectively connected to electrodes on the circuit board. The protruding end portions of the signal and drain wires, excluding tip portions of the end portions, are received in and covered with the heat-shrinkable tube.

The second cable assembly includes a composite cable, a connector, and a bilayer heat-shrinkable tube. The composite cable includes two signal wires for differential transmission, a drain wire, a shield conductor, and an outer insulator. The tuboid shield conductor is disposed inside the tuboid outer insulator. The signal and drain wires are disposed inside the shield conductor. Lengthwise end portions of the shield conductor and the outer insulator are cut away such as to protrude end portions of the signal and drain wires from the shield conductor and the outer insulator. The protruding end portions of the signal and drain wires are respectively connected to terminals of the connector. The end portions of the signal and drain wires are received in and covered with the tuboid bilayer heat-shrinkable tube. The inner layer of the bilayer heat-shrinkable tube is an electroconductive layer, and the outer layer is an insulator.

CITATION LIST

Patent Literature

Patent Literature 1: Japanese Unexamined Patent Application Publication No. 2002-135938
Patent Literature 2: Japanese Unexamined Patent Application Publication No. 2005-38617

SUMMARY OF INVENTION

Technical Problem

As described above, the protruding end portions of the signal and drain wires are covered with the heat-shrinkable tube, which suppresses impedance increases at the end portions of the signal and drain wires to match between the end portions and other portions. However, it takes time and effort to fix the heat-shrinkable tube over the end portions of the signal and drain wires. This is because of requirement to heat and shrink with the heat the heat-shrinkable tube after inserting the end portions of the signal and drain wires into the heat-shrinkable tube.

The invention is devised in view of the above circumstances to provide a cable assembly with reduced characteristic impedance at a protruding end portion of a first wire of a cable and configured for easy manufacture, and to provide a method for manufacturing the cable assembly.

Solution to Problem

To solve the above problem, a cable assembly of the invention includes a first connecting member having electrical conductivity, a cable, and an electroconductive member. The cable includes an outer insulator, a shield conductor disposed inside the outer insulator, and at least one first wire. The first wire is a signal wire disposed inside the shield conductor. The first wire includes a protruding portion protruding substantially in a first direction from the shield conductor and the outer insulator. A core wire of the protruding portion is connected to the first connecting member. The first direction is the longitudinal direction of the cable. The electroconductive member is an electroconductive plate or electroconductive tape wound around at least a part in the first direction of the protruding portion.

The cable assembly of this aspect provides the following technical features and effects. Firstly, impedance is lowered in the protruding portion of the first wire because of the electroconductive member is wound around at least the part of the protruding portion of the first wire. This contributes to matched impedances between the protruding portion of the first wire and the portion of the first wire located inside the shield conductor and the outer insulator. Secondly, the cable assembly is easy to manufacture. This is because the electroconductive member provided as the electroconductive plate or electroconductive tape is simply wound around at least the part of the protruding portion, thereby greatly facilitating attachment of the electroconductive member to the protruding portion.

A pair of the first connecting members may be provided. The cable may include a pair of first wires. The electroconductive member may be wound around at least the parts of the protruding portions of the first wires. The cable assembly of this aspect is more easily manufacturable. Even if the protruding portions of the first wires are spaced from each other, the electroconductive member can be wound around the at least parts of the protruding portions while bringing the protruding portions closer to each other.

The first connecting members may be spaced apart from each other in a second direction, the second direction crossing the first direction. The first wires may be configured to transmit a differential signal. The electroconductive member may be wound around at least the parts of the protruding portions of the first wires such that a distance in the second direction between the parts of the protruding portions of the first wires is smaller than a distance in the second direction between the first connecting members.

In the cable assembly of this aspect, impedance is further lowered in the protruding portion because the distance in the second direction between the parts of the protruding portions of the first wires is smaller than the distance in the second direction between the first connecting members. This contributes to matched impedances between the protruding portions of the first wires and the portions of the first wires located inside the shield conductor and the outer insulator.

The electroconductive member may include a first end portion and a second end portion opposite to the first end portion. The electroconductive member may be wound around the at least part of the protruding portion such that at least one of the first and second end portions is in contact with the electroconductive member. In the cable assembly of this aspect, it is easy to wind the electroconductive member around the protruding portion. This is because it is desirable to wind the electroconductive member around the at least part of the protruding portion such that at least one of the first and second end portions is in contact with the electroconductive member.

Alternatively, the electroconductive member may be wound around the at least part of the protruding portion such that the first end portion and the second end portion face each other with a clearance therebetween. In the cable assembly of this aspect, it is easy to wind the electroconductive member around the protruding portion. This is because it is desirable to wind the electroconductive member around the at least part of the protruding portion such that the first end portion and the second end portion face each other with a clearance therebetween.

The electroconductive member may float electrically. The cable assembly of this aspect is more easily manufacturable. This is because there is no need to electrically connect the electroconductive member to other component.

The electroconductive member may be electrically connected to the shield conductor of the cable. In the cable assembly of this aspect, the electroconductive member can be easily grounded through the shield conductor.

The cable assembly of any aspect described above may further include a shield case at least covering the protruding portion of the first wire, the electroconductive member, and a connection point at which the core wire of the protruding portion is connected to the first connecting member.

The electroconductive member may be electrically connected to the shield case. In the cable assembly of this aspect, the electroconductive member can be easily grounded through the shield case.

The cable assembly of any aspect described above may further include a second connecting member having electrical conductivity. The cable may further include a second wire inside the shield conductor. The second wire may be other than a signal wire and include a protruding portion. The protruding portion of the second wire may protrude in the first direction from the shield conductor and the outer insulator. A core wire of the protruding portion of the second wire may be connected to the second connecting member. The electroconductive member may be wound only around the at least parts of the protruding portions of the first wires.

The second connecting member may be disposed on one side in a third direction relative to the first connecting members, the third direction crossing the first and second directions. The protruding portion of the second wire may be disposed on the one side in the third direction relative to the protruding portions of the first wires. The cable assembly of this aspect is more easily manufacturable for the following reason. As the second connecting member and the protruding portion of the second wire are located on the one side in the third direction relative to the first connecting members and the protruding portions of the first wires, the second wire is not likely to obstruct the winding of the electroconductive member around the at least part of the protruding portion of the first wires.

The cable assembly of any aspect described above may further include an insulating body holding the first and second connecting members. In this case, the first and second connecting members may be terminals. The body may be replaced with a circuit board. In this case, the first and second connecting members may not be terminals but electrodes on the circuit board.

A method for manufacturing a cable assembly of the invention includes cutting away an end portion of an outer insulator and an end portion of a shield conductor inside the outer insulator of a cable so as to protrude an end portion of a first wire in a first direction from the shield conductor and the outer insulator, the first wire being a signal wire, the first direction being a longitudinal direction of the cable; connecting a core wire of the end portion of the first wire to a terminal or to an electrode of a circuit board; and winding an electroconductive plate or electroconductive tape around at least a part in the first direction of the end portion of the first wire after the connection of the core wire of the first wire. It should be noted that the winding of electroconductive plate or electroconductive tape may be performed before the connection of the core wire of the first wire.

The method for manufacturing the cable assembly of this aspect provides the following technical features and effects. Firstly, it is possible to lower the impedance in the end portion of the first wire simply by winding the electroconductive plate or electroconductive tape around at least the part of the end portion of the first wire. This contributes to matched impedances between the end portion of the first wire and the portion of the first wire located inside the shield conductor and the outer insulator. Secondly, the method contributes to easy manufacture of the cable assembly. This is because the electroconductive plate or electroconductive tape is simply wound around at least the part of the end portion of the first wire, greatly facilitating attachment of the electroconductive plate or electroconductive tape to the end portion of the first wire.

A pair of first wires may be provided. A pair of the terminals or a pair of the electrodes of the circuit board may be provided. The connection of the core wire of the first wire may include connecting the core wires of the end portions of the first wires respectively to the terminals or to the electrodes of the circuit board. The winding of the electroconductive plate or electroconductive tape may include winding the electroconductive plate or electroconductive tape around the at least parts of the end portions of the first wires.

The manufacturing method of this aspect further contributes to easy manufacture of the cable assembly. Even if the protruding portions of the first wires are spaced from each other, the electroconductive member can be wound around the at least parts of the protruding portions while bringing the protruding portions closer to each other.

The terminals or the electrodes of the circuit board may be spaced apart from each other in a second direction, the second direction crossing the first direction. The winding of the electroconductive plate or electroconductive tape may include winding the electroconductive plate or electroconductive tape around the at least parts of the end portions of the first wires such that a distance in the second direction between the parts of the end portions of the first wires is smaller than a distance in the second direction between the terminals or electrodes.

In the manufacturing method of this aspect, impedance is further to lowered in the end portions of the first wires because the distance in the second direction between the parts of the end portions of the first wires is smaller than the distance in the second direction between the terminals or electrodes. This further contributes to matched impedances between the end portions of the first wires and the portions of the first wires located inside the shield conductor and the outer insulator.

The electroconductive plate or electroconductive tape may include a first end portion and a second end portion opposite to the first end portion. The winding of the electroconductive plate or electroconductive tape may include winding the electroconductive plate or electroconductive tape around the at least part of the end portion of the first wire such that at least one of the first end portion and the second end portion is in contact with the electroconductive plate or electroconductive tape, or alternatively such that the first end portion and the second end portion face each other with a clearance therebetween.

The manufacturing method of these aspects facilitates the winding of the electroconductive plate or electroconductive tape around the protruding portion. This is because it is desirable to wind the electroconductive plate or electroconductive tape around the at least part of the protruding portion such that one of one of the first and second end portions of the electroconductive plate or electroconductive tape is in contact with the electroconductive plate or electroconductive tape, or alternatively such that the first and second end portions of the electroconductive plate or electroconductive tape face each other with a clearance therebetween.

The manufacturing method of any aspect described above may further include bringing the electroconductive plate or electroconductive tape into electrical connection with the shield conductor of the cable. In the manufacturing method of this aspect, the electroconductive plate or electroconductive tape can be easily grounded through the shield conductor.

The manufacturing method of any aspect described above may further include placing a shield case such as to at least cover the end portion of the first wire, the electroconductive plate or electroconductive tape, and a connection point at which the core wire of the end portion of the first wire is connected to the terminal or to the electrode of the circuit board.

The manufacturing method may further include bringing the shield case into electrical connection with the electroconductive plate or electroconductive tape. In the manufacturing method of this aspect, the electroconductive plate or electroconductive tape can be easily grounded through the shield case.

The cable may further include a second wire inside the shield conductor, the second wire not being a signal wire and including a protruding portion. The cutting of the outer insulator and the shield conductor of the cable may include protruding the end portion of the first wire and an end portion of the second wire in the first direction of the cable from the shield conductor and the outer insulator. The connection of the core wire of the first wire may include connecting a core wire of the end portion of the second wire to another terminal or to another electrode of the circuit board. The winding of the electroconductive plate or electroconductive tape may include winding the electroconductive plate or electroconductive tape only around the at least part of the end portion of the first wire.

In the manufacturing method of this aspect, the electroconductive plate or electroconductive tape is simply wound only around the end portion of the first wire, thereby greatly facilitating attachment of the electroconductive plate or electroconductive tape to the end portion of the first wire.

DESCRIPTION OF EMBODIMENTS

Figure 1A:
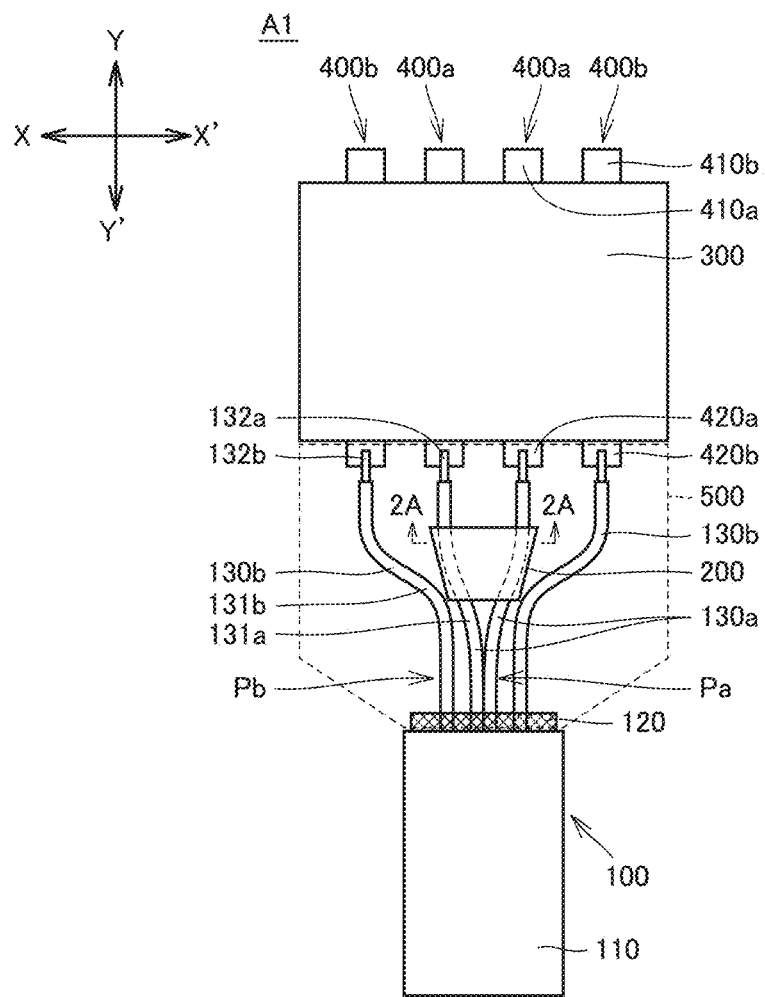
FIG. 1A is a schematic plan view of a cable assembly according to the first embodiment of the invention, with a shield case shown as transparent.

The first to third embodiments of the invention will be described hereinafter.

First Embodiment

A cable assembly A1 according to the first embodiment of the invention will be hereinafter described with reference to FIG. 1A to FIG. 3B. The cable assembly A1 includes a cable 100, an electroconductive member 200, a body 300, a pair of terminals 400a (first connecting member), a pair of terminals 400b (second connecting member), and a shield case 500. These components of the cable assembly A1 will be described in detail. It should be noted that the Y-Y' direction shown in FIG. 1A and FIG. 1B corresponds to the longitudinal direction of the cable 100 and also corresponds to the first direction in the claims. The X-X' direction shown in FIG. 1A corresponds to the array direction of the terminals 400a, 400b and also corresponds to the second direction in the claims. The X-X' direction orthogonally crosses the Y-Y' direction. The Z-Z' direction shown in FIG. 1B corresponds to the third direction in the claims. The Z-Z' direction orthogonally crosses the Y-Y' and X-X' directions.

Figure 1B:
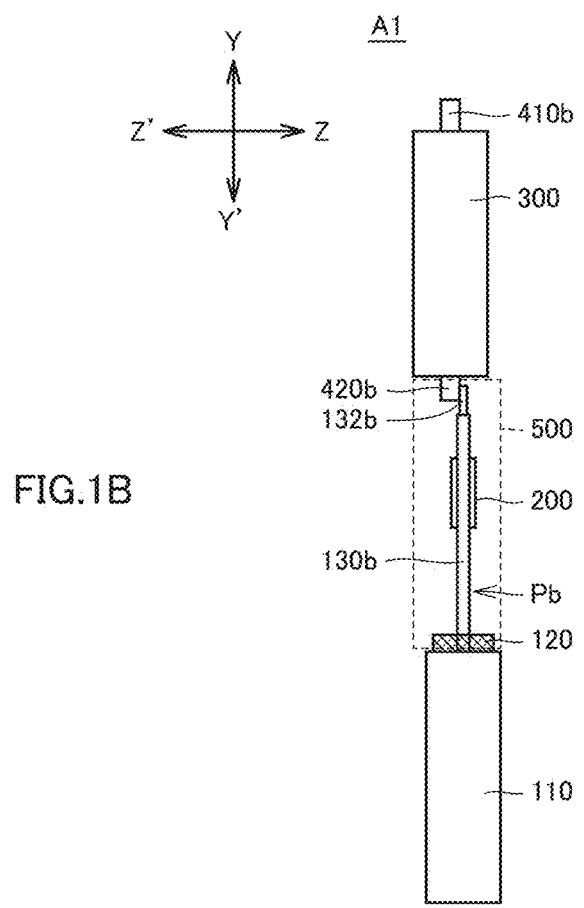
FIG. 1B is a schematic side view of the cable assembly, with the shield case shown as transparent.

As shown in FIG. 1A and FIG. 1B, the cable 100 includes an outer insulator 110, a shield conductor 120, a pair of first wires 130a, and a pair of second wires 130b. FIG. 1A and FIG. 1B show only part of the cable 100.

The outer insulator 110 is a tuboid sheath. The shield conductor 120 is a tuboid braided conductive wires or a spirally wound tape made of metal film, and the shield conductor 120 is disposed inside the outer insulator 110. The first wires 130a and the second wires 130b are disposed inside the shield conductor 120. The outer insulator 110 and the shield conductor 120 are cut away at their Y-direction end portions. Accordingly, the Y-direction end portions (hereinafter referred to as protruding portions Pa) of the first wires 130a and the Y-direction end portions (hereinafter referred to as protruding portions Pb) of the second wires 130b protrude in the Y direction from the outer insulator 110 and the shield conductor 120.

Figure 2A:
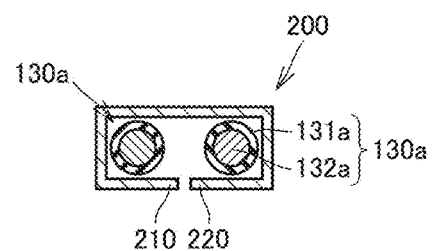
FIG. 2A is an end view of the cable assembly including an aspect of the electroconductive member, taken along line 2A-2A in FIG. 1A.
Figure 2B:
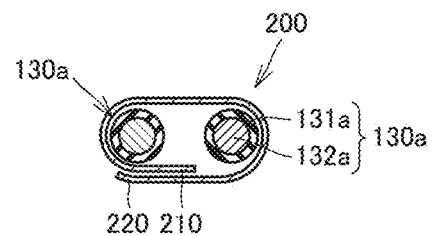
FIG. 2B is an end view of the cable assembly including another aspect of the electroconductive member, taken along line 2A-2A in FIG. 1A.

The first wires 130a are signal wires forming a differential pair for transmission of high frequency signals (differential signals). The first wires 130a each include an inner insulator 131a and a core wire 132a. Each core wire 132a is disposed inside each tuboid inner insulator 131a as shown in FIG. 2A and FIG. 2B. As shown in FIG. 1A and FIG. 1B, the protruding portion Pa of each first wire 130a is configured such that the Y-direction end portion of the inner insulator 131a is cut away to protrude the Y-direction end portion of the core wire 132a.

The second wire 130b may each be a wire other than a signal wire (e.g. a power wire, a ground wire, or a drain wire) or a low speed signal wire (e.g. a signal wire for transmission of signals of lower speed than the aforementioned high frequency signals). Each second wire 130b includes an inner insulator 131b and a core wire 132b. As shown in FIG. 2A and FIG. 2B, the core wire 132b is disposed inside the tuboid inner insulator 131b. As shown in FIG. 1A and FIG. 1B, the protruding portion Pb of the second wire 130b is configured such that the Y-direction end portion of the inner insulator 131b is cut away to protrude the Y-direction end portion of the core wire 132b.

As shown in FIG. 1A and FIG. 1B, the body 300 is a block of insulating resin. The body 300 holds the terminals 400b, 400a, 400a, 400b, in this order, with intervals therebetween in the X-X' direction. The terminals 400a and 400b may be insert-molded in the body 300 or securely press-fitted in holes or grooves in the body 300.

The pair of the terminals 400a forms a differential pair for transmission of high frequency signals (differential signals). Each terminal 400a includes a contact portion 410a and a tail 420a. The contact portion 410a is the Y-direction end portion of the terminal 400a and protrudes from the body 300 in the Y direction. The contact portion 410a is contactable with a signal transmission terminal of a connection target (not shown), such as a mating connector, for connection with the cable assembly A1. Each tail 420a is the Y'-direction end portion of the terminal 400a and protrudes from the body 300 in the Y' direction. Each tail 420a is connected to the end portion of the core wire 132a of the protruding portion Pa of the associate first wire 130a by soldering or other means.

The terminals 400b are each a terminal other than a signal terminal (e.g. a power terminal, a ground terminal, or a drain terminal) or a low speed signal terminal (e.g. a signal terminal for transmission of signals of lower speed than the aforementioned high frequency signals). Each terminal 400b includes a contact portion 410b and a tail 420b. The contact portion 410b is the Y-direction end portion of the terminal 400b and protrudes from the body 300 in the Y direction. The contact portions 410b are contactable with other terminals of the connection target. Each tail 420b is the Y'-direction end portion of the terminal 400b and protrudes from the body 300 in the Y' direction. Each tail 420b is connected to the end portion of the core wire 132b of the protruding portion Pb of the corresponding second wire 130b by soldering or other means.

The electroconductive member 200 is an electroconductive plate (e.g. a metal plate or a pressed metal plate) or an electroconductive tape (e.g. a copper film tape). The electroconductive member 200 in a flat state (unwound state) has a Y-Y' direction dimension that is smaller than that of the protruding portions Pa of the first wires 130a. The electroconductive member 200 has such an X-X' direction dimension as to surround and cover the protruding portions Pa of the first wires 130a. It is preferable that the electroconductive member 200 has such a Y-Y' direction dimension, an X-X' direction dimension, and a thickness as to achieve matched impedances between the protruding portion Pa of each first wire 130a and the part of each first wire 130a that is located inside the shield conductor 120 and the outer insulator 110.

The electroconductive member 200 includes a first end portion 210 and a second end portion 220. The second end portion 220 is provided at an opposite side from the first end portion 210. The electroconductive member 200 is wound and wrapped around parts in the Y-Y' direction of the protruding portions Pa of the first wires 130a (e.g. intermediate parts in the Y-Y' direction of the protruding portions Pa). For example, FIG. 2A shows an aspect of the electroconductive member 200, which is wound around the parts in the Y-Y' direction of the protruding portions Pa of the first wires 130a such that the first end portion 210 and the second end portion 220 face each other with a clearance therebetween. FIG. 2B shows another aspect of the electroconductive member 200, which is wound around the parts in the Y-Y' direction of the protruding portions Pa of the first wires 130a such that the first end portion 210 is in contact with the electroconductive member 200 from inside and the second end portion 220 is in contact with the electroconductive member 200 from outside. In either of these aspects, the electroconductive member 200 is fixed to the parts of the protruding portions Pa of the first wires 130a. The fixation of the electroconductive member 200 is achieved by winding the electroconductive member 200, by swaging the electroconductive member 200, using a bonding agent, and/or using an adhesive agent. It should be noted that the electroconductive member 200 is not wound around the protruding portions Pb of the second wires 130b.

The electroconductive member 200 may be configured such as to (1) float electrically or (2) be electrically connected to the shield conductor 120 and/or the shield case 500. The electroconductive member 200 in configuration (1)

is not in contact or electrical connection with the shield conductor 120 of the cable 100 and/or the shield case 500. The electroconductive member 200 in configuration (2) may be (2a) in direct contact and electrical connection with the shield conductor 120 and/or the shield case 500 or (2b) in electrical connection with the shield conductor 120 and/or the shield case 500 by connection means (not shown), such as a pin, solder, an electroconductive bonding agent, and a lead wire. In either of configurations (2a) and (2b), the electroconductive member 200 is grounded through the shield conductor 120 and/or the shield case 500.

As shown in FIG. 1A and FIG. 1B, the shield case 500 is a metal tube and has openings that respectively open in the Y and Y' directions. The shield case 500 houses (covers) at least the protruding portions Pa of the first wires 130a, the protruding portions Pb of the second wires 130b, the electroconductive member 200, a plurality of first connection points, and a plurality of second connection points. The first connection points are points at which the tails 420a of the terminals 400a are connected to the core wires 132a of the protruding portions Pa of the first wires 130a. The second connection points are points at which the tails 420b of the terminals 400b are connected to the core wires 132b of the protruding portions Pb of the second wires 130b. The body 300 is located outside of the shield case 500, particularly on the side of the Y-direction-side opening of the shield case 500. The cable 100 is led through the Y'-direction-side opening of the shield case 500 to the outside of the shield case 500. FIG. 1A and FIG. 1B show the shield case 500 in dashed lines for the convenience of explanation.

The shield case 500 can be composed of two or more pieces that may be removably assembled together in the X-X' or Z-Z' direction. The shield case 500 may preferably connected electrically to, but not limited thereto, the shield conductor 120 of the cable 100 by direct contact or via other connection means (not shown, such as a pin, solder, an electroconductive bonding agent, and a lead wire). The shield case 500 may be grounded by contacting a shield case of the aforementioned connection target.

A method for manufacturing the cable assembly A1 configured as described above will be hereinafter described. The cable 100 is prepared. The Y-direction end portion of the outer insulator 110 and the end portion of the shield conductor 120 of the cable 100 are cut away so as to protrude the Y-direction end portions of the first wires 130a and the Y-direction end portions of the second wires 130b from the outer insulator 110 and the shield conductor 120. The Y-direction end portions of the first wires 130a form the protruding portions Pa, and the Y-direction end portions of the second wires 130b form the protruding portions Pb. The Y-direction end portions of the inner insulators 131a of the protruding portions Pa are cut away so as to protrude the Y-direction end portions of the core wires 132a protrude from the inner insulators 131a. The Y-direction end portions of the inner insulators 131b of the protruding portions Pb are cut away so as to protrude the Y-direction end portions of the core wires 132b from the inner insulators 131b.

The body 300, the terminals 400a and the terminals 400b are prepared. The body already holds the terminals 400b, 400a, 400a, 400b, in this order, with intervals therebetween in the X-X' direction. The protruding core wires 132a of the protruding portions Pa of the first wires 130a are connected to the respective terminals 400a by soldering or other means, and these connection points from the first connection points. The protruding core wires 132b of the protruding portions Pb of the second wires 130b are connected to the associated terminals 400b by soldering or other means, and these connection points from the second connection points.

Then the electroconductive member 200 is prepared. The electroconductive member 200 is wound around and fixed to parts in the Y-Y' direction of the protruding portions Pa of the first wires 130a. Specifically, one of the following procedures 1) or 2) is adopted. 1) The electroconductive member 200 being an electroconductive plate is bent or curved such that the first end portion 210 and the second end portion 220 face each other with a clearance therebetween, and the electroconductive member 200 is wound around only the parts in the Y-Y' direction of the protruding portions Pa of the first wires 130a. 2) The electroconductive member 200 being an electroconductive tape is wound around only the parts in the Y-Y' direction of the protruding portions Pa of the first wires 130a such that the first end portion 210 and the second end portion 220 overlap with each other. In the procedure 2), the first end portion 210 is brought into contact with the electroconductive member 200 from inside, and the second end portion 220 is brought into contact with the electroconductive member 200 from outside. In either procedure 1) or 2), the electroconductive member 200 is fixed only to the parts in the Y-Y' direction of the protruding portions Pa. This fixing may be performed through the following procedures, in place of the winding. 3) After or during the winding, the electroconductive member 200 is swaged such that the first and the second end portions 210, 220 extend inward, so that the electroconductive member 200 is fixed only to the portions in the Y-Y' direction of the protruding portion Pa. 4) A bonding agent or an adhesive agent is applied on the electroconductive member 200 as wound and the parts in the Y-Y' direction of the protruding portions Pa, so that the electroconductive member 200 is fixed only to the portions in the Y-Y' direction of the protruding portions Pa. The procedure 1) or 2) of winding the electroconductive member 200 may be performed prior to the steps of connecting the first wires 130a to the terminals 400a and connecting the second wires 130b to the terminals 400b.

To configure the electroconductive member 200 as floating electrically, the electroconductive member 200 is so placed as not to be in contact with the shield conductor 120. To configure the electroconductive member 200 as electrically connected to the shield conductor 120, the electroconductive member 200 is brought into direct contact with the shield conductor 120 when fixing the electroconductive member 200 to the protruding portions Pa, or alternatively, the electroconductive member 200 is fixed to the shield conductor 120 and then electrically connected to the shield conductor 120 by the aforementioned connection means.

Then the shield case 500 is prepared. The pieces of the shield case 500 is assembled such that the assembled shield case 500 houses at least the protruding portions Pa of the first wires 130a, the protruding portions Pb of the second wires 130b, the electroconductive member 200, the first connection points and the second connection points.

To configure the electroconductive member 200 as floating electrically, the electroconductive member 200 is disposed in midair inside the shield case 500. To configure the electroconductive member 200 as electrically connected to the shield conductor 120, the pieces of the shield case 500 are assembled with the electroconductive member 200 in contact with the shield case 500, or alternatively, the pieces of the shield case 500 are assembled with the electroconductive member 200 in electrical connection with at least one of the pieces by the aforementioned other connection means.

The following describes measurements of impedances of the first wires 130a conducted in a case (hereinafter referred to as the first experimental example) where the electroconductive member 200 is not attached to the parts of the protruding portions Pa of the first wires 130a of the cable assembly A1, and in a case (hereinafter referred to as the second experimental example) where the electroconductive member 200 is attached to the parts of the protruding portions Pa of the first wires 130a of the cable assembly A1. These measurements are made passing differential step pulse signals of a rise time of 200 μs through the first wires 130a.

Figure 3A:
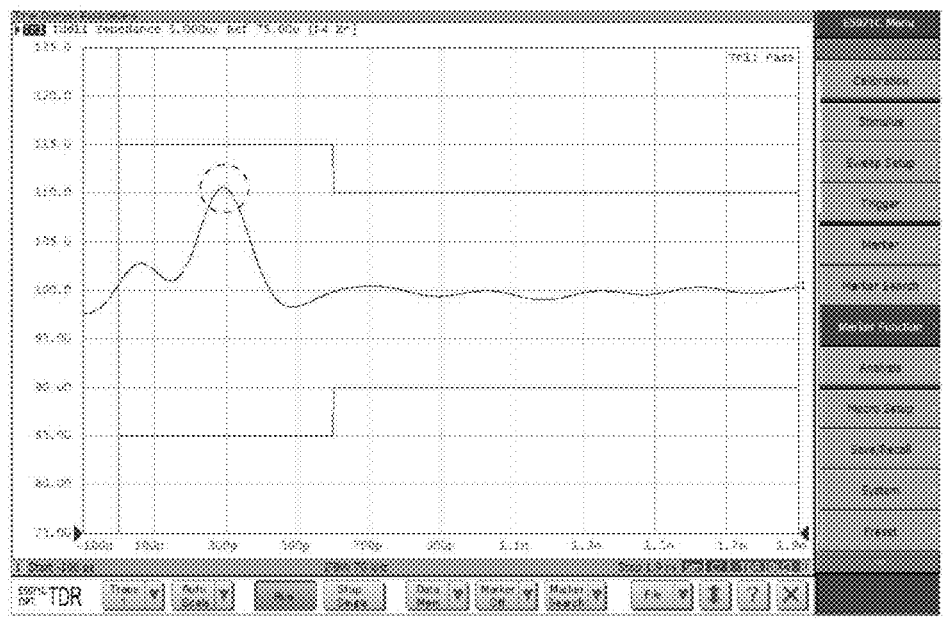
FIG. 3A is a graph showing characteristic impedance of a pair of first wires of a cable assembly, not including an electroconductive member, according to the first experimental example.
Figure 3B:
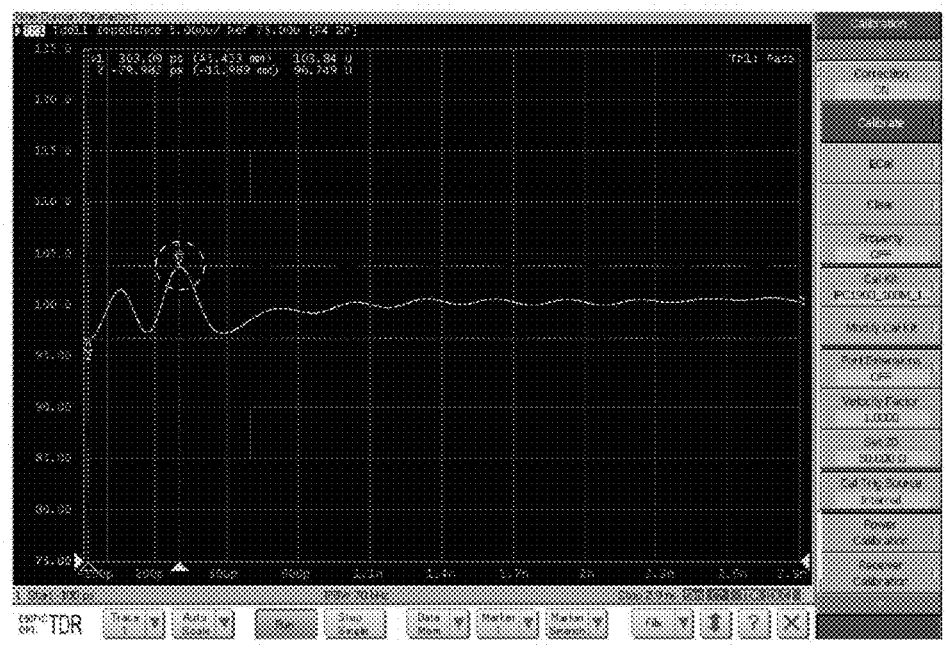
FIG. 3B is a graph showing characteristic impedance of a pair of first wires of a cable assembly, including an electroconductive member, according to the second experimental example.

FIG. 3A shows the measurement result of the first experimental example. In the first experimental example, the parts (intermediate parts) of the protruding portions Pa exhibited impedance of approximately 110.8Ω as indicated by a dashed line. FIG. 3B shows the measurement result of the second experimental example. In the second experimental example, the parts (intermediate parts) of the protruding portions Pa exhibited impedance of approximately 104.0Ω as indicated by a dashed line. It is thus found that the protruding portions Pa of the first wires 130a is lower in the second experimental example (including the electroconductive member 200) than the first experimental example (not including the electroconductive member 200).

The cable assembly A1 and its manufacturing method described above provide the following technical features and effects. Firstly, impedance is lowered in the protruding portions Pa of the first wires 130a because of the electroconductive member 200 is wound around the parts of the protruding portions Pa of the first wires 130a. This contributes to matched impedances between the protruding portions Pa of the first wires 130a and the portions of the first wires 130a that are located inside the shield conductor 120 and the outer insulator 110.

Secondly, the cable assembly A1 is easy to manufacture for the following reasons. 1) The electroconductive member 200 is simply wound around the parts of the protruding portions Pa of the first wires 130a, facilitating attachment of the electroconductive member 200 to the protruding portions Pa of the first wires 130a. Even if the protruding portions Pa of the first wires 130a are spaced from each other, the electroconductive member 200 can be wound around the parts of the protruding portions Pa while bringing the protruding portions Pa closer to each other. 2) The electroconductive member 200 can be wound around the parts of the protruding portions Pa of the first wires 130a after connecting the first wires 130a to the terminal 400a and the second wires 130b to the terminals 400b. In other words, the protruding core wires 132a of the protruding portions Pa can be easily connected to the terminals 400a because this connection work is made before bundling the protruding portions Pa of the first wires 130a with the electroconductive member 200. 3) The protruding portions Pa of the first wires 130a are bundled with the electroconductive member 200, facilitating the handling of the bundled protruding portions Pa of the first wires 130a when manufacturing the cable assembly A1. 4) The protruding portions Pa of the first wires 130a, the protruding portions Pb of the second wires 130b, the electroconductive member 200, and the first and second connection points are simply housed in the shield case 500. 5) If the electroconductive member 200 is configured as floating electrically, it is possible to omit the step of electrically connecting the electroconductive member 200.

Thirdly, the cable assembly A1 has improved electromagnetic compatibility (EMC) characteristic. This is because the shield case 500 houses the protruding portions Pa of the first wires 130a, the protruding portions Pb of the second wires 130b, the electroconductive member 200, and the first and second connection points.

Second Embodiment

Figure 4:
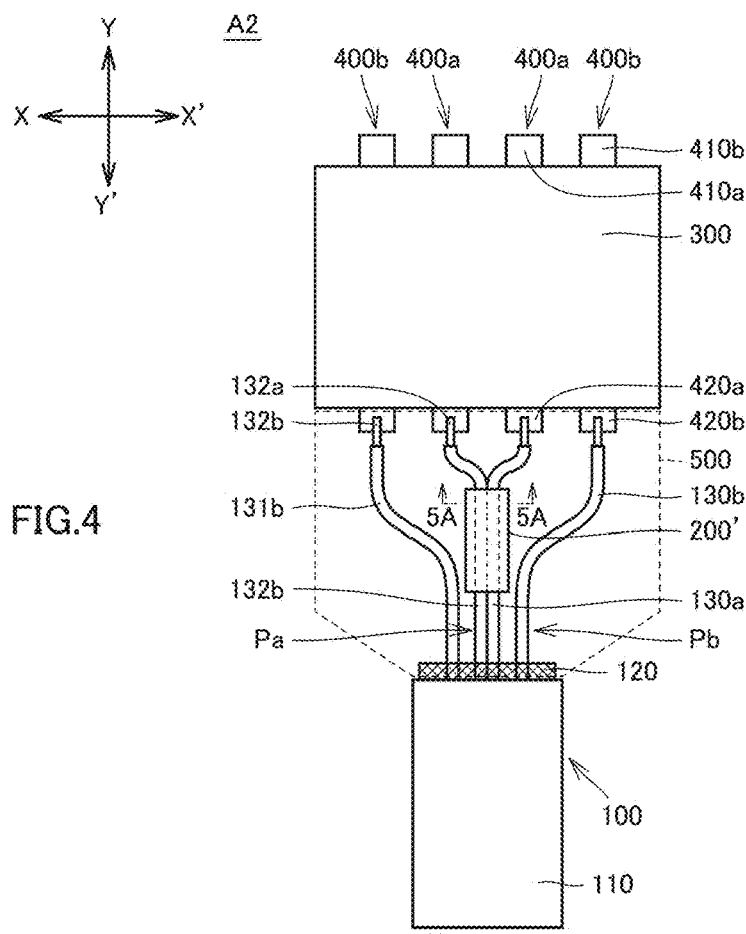
FIG. 4 is a schematic plan view of a cable assembly according to the second embodiment of the invention, with a shield case shown as transparent.
Figure 5A:
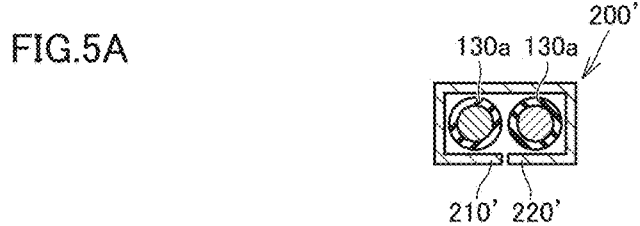
FIG. 5A is an end view of the cable assembly including an aspect of the electroconductive member, taken along line 5A-5A in FIG. 4.
Figure 5B:
FIG. 5B is an end view of the cable assembly including another aspect of the electroconductive member, taken along line 5A-5A in FIG. 4.

A cable assembly A2 according to the second embodiment of the invention will be hereinafter described with reference to FIG. 4 to FIG. 5B. The cable assembly A2 has the same configuration to that of the cable assembly A1, except the following difference. The difference is that the electroconductive member 200' has a different configuration from that of the electroconductive member 200. The difference will be solely described in detail, without repeating descriptions on the cable assembly A2 that overlap with those of the cable assembly A1. FIG. 4 shows the Y-Y' and X-X' directions in a similar manner to the assembly A1. FIG. 4, shows only part of the cable 100 and shows the shield case 500 in dashed lines.

The electroconductive member 200' is an electroconductive plate (e.g. a metal plate or a pressed metal plate) or an electroconductive tape (e.g. a copper film tape). The electroconductive member 200' has a Y-Y' direction dimension that is smaller than that of the protruding portions Pa of the first wires 130a. The electroconductive member 200' in a flat state (unwound state) has such an X-X' direction dimension as to surround and cover the protruding portions Pa of the first wires 130a. It is preferable that the electroconductive member 200' has such a Y-Y' direction dimension, an X-X' direction dimension, and a thickness as to achieve matched impedances between the protruding portion Pa of each first wire 130a and the part of each first wire 130a that is located inside the shield conductor 120 and the outer insulator 110.

As best illustrated in FIG. 4, the electroconductive member 200' is wound and wrapped around parts in the Y-Y' direction of the protruding portions Pa of the first wires 130a (e.g. intermediate parts in the Y-Y' direction of the protruding portions Pa) such that the distance in the X-X' direction between portions other than distal parts of the protruding portions Pa of the first wires 130a (including parts in the Y-Y' direction of the protruding portion Pa) is smaller than the distance in the X-X' direction between the terminals 400a. Here the distal parts of the protruding portions Pa are the parts on the Y-direction side relative to the parts of the protruding portions Pa around which the electroconductive member 200' is wound. The portions other than the distal parts of the protruding portions Pa of the first wires 130a may be in contact with each other or may be arranged with an interval therebetween. Some examples of these arrangements are shown in FIG. 5A and FIG. 5B. FIG. 5A shows an aspect of the electroconductive member 200', which is wound around the parts in the Y-Y' direction of the protruding portions Pa of the first wires 130a such that the first end portion 210' and the second end portion 220' of the electroconductive member 200' face each other with a clearance therebetween. FIG. 5B another aspect of the electroconductive member 200', which is wound around the part in the Y-Y' direction of the protruding portions Pa of the first wires 130a such that the first end portion 210' is in contact with the electroconductive member 200' from inside and the second end portion 220' is in contact with the electroconductive member 200' from outside. In either of these aspects, the electroconductive member 200' is fixed to the parts of the protruding portions Pa of the first wires 130a. The fixation of the electroconductive member 200' is achieved by winding the electroconductive member 200', by swaging the electroconductive member 200', using a bonding agent, and/or using an adhesive agent. It should be noted that the electroconductive member 200' is not wound around the protruding portions Pb of the second wires 130b.

As described for the first embodiment, the electroconductive member 200' may be configured to float electrically or to be electrically connected to the shield conductor 120 and/or the shield case 500.

A method for manufacturing the cable assembly A2 configured as described above is substantially the same as the method for manufacturing the cable assembly A1. The difference is that the electroconductive member 200' is wound in different steps from that of the electroconductive member 200 of the first embodiment. Hereinafter solely described are the steps of winding the electroconductive member 200' only.

The following steps of winding the electroconductive member 200' are performed before or after the steps of connecting the first wires 130a to the terminals 400a and connecting the second wires 130b to the terminals 400b. The electroconductive member 200' being an electroconductive plate is bent or curved such that the first end portion 210' and the second end portion 220' face each other with a clearance therebetween, and the electroconductive member 200' is wound around only the parts in the Y-Y' direction of the protruding portions Pa of the first wires 130a. This winding results in that the distance in the X-X' direction of the portions other than the distal parts of the protruding portions Pa of the first wires 130a is smaller than the distance in the X-X' direction between the terminals 400a. The electroconductive member 200' being an electroconductive tape is wound around only the parts in the Y-Y' direction of the protruding portions Pa of the first wires 130a such that the first end portion 210' and the second end portion 220' are in contact with each other. This winding results in that the first end portion 210' and the second end portion 220' overlap each other, with the first end portion 210' in contact with the electroconductive member 200' from inside and the second end portion 220' in contact with the electroconductive member 200' from outside, and that the distance in the X-X' direction of the portions other than the distal parts of the protruding portions Pa of the first wires 130a is smaller than the distance in the X-X' direction between the terminals 400. The electroconductive member 200' thus wound is fixed only to the parts in the Y-Y' direction of the protruding portion Pa. This fixing may be performed through the following procedure, in place of the winding. 1) After or during the winding, the electroconductive member 200' is swaged such that the first and the second end portions 210', 220' extend inward, so that the electroconductive member 200' is fixed only to the parts in the Y-Y' direction of the protruding portion Pa. 2) A bonding agent or an adhesive agent is applied on the electroconductive member 200' as wound and the parts in the Y-Y' direction of the protruding portions Pa, so that the electroconductive member 200' is fixed only to the parts in the Y-Y' direction of the protruding portions Pa.

The cable assembly A2 and its manufacturing method described above provide technical features and effects similar to those of the cable assembly A1 and its manufacturing method. The cable assembly A2 and its manufacturing method further provide the following technical features and effects. Impedance is further lowered in the protruding portions Pa of the first wires 130a because the winding of the electroconductive member 200' results in that the distance in the X-X' direction of the portions other than the distal parts of the protruding portions Pa of the first wires 130a is smaller than the distance in the X-X' direction between the terminals 400a. This further contributes to matched impedances between the protruding portions Pa of the first wires 130a and the portions of the first wires 130a that are located inside the shield conductor 120 and the outer insulator 110. Further, if the electroconductive member 200' was wound not only around the protruding portions Pa of the first wires 130a but also around the protruding portions Pb of the second wires 130b, it would be difficult to arrange the portions other than the distal parts of the protruding portions Pa of the first wires 130a at a smaller distance therebetween in the X-X' direction than the distance in the X-X' direction between the terminals 400a. This is in contrast with the cable assembly A2 with the electroconductive member 200' wound only around the parts of the protruding portions Pa of the first wires 130a. It is therefore easy to arrange the portions other than the distal parts of the protruding portions Pa of the first wires 130a at a smaller distance therebetween in the X-X' direction than the distance in the X-X' direction between the terminals 400a.

Third Embodiment

Figure 6A:
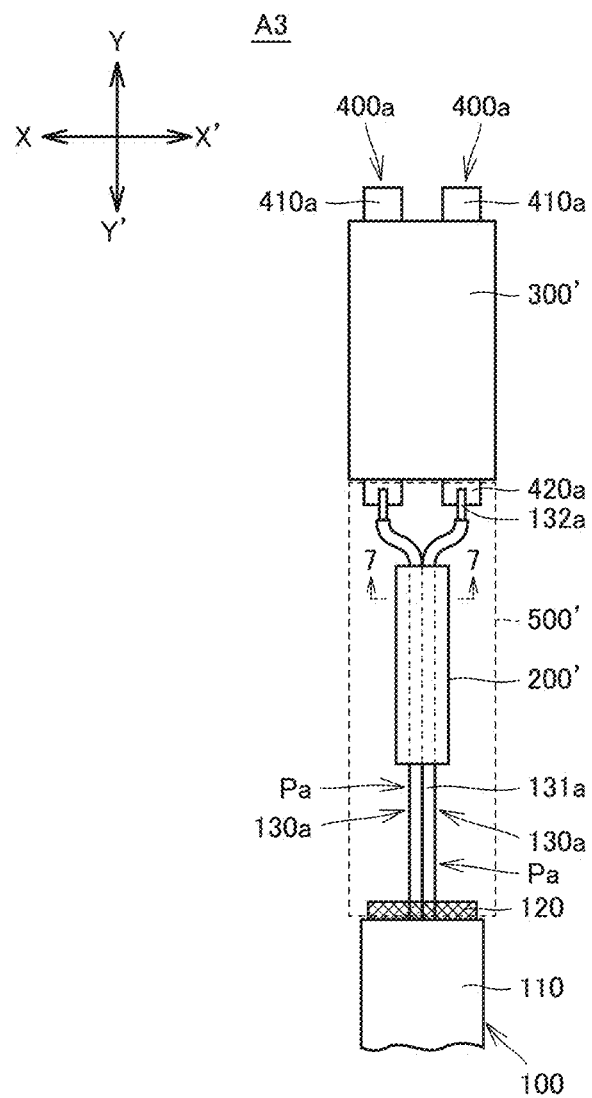
FIG. 6A is a schematic plan view of a cable assembly according to the third embodiment of the invention, with a shield case shown as transparent.
Figure 6B:
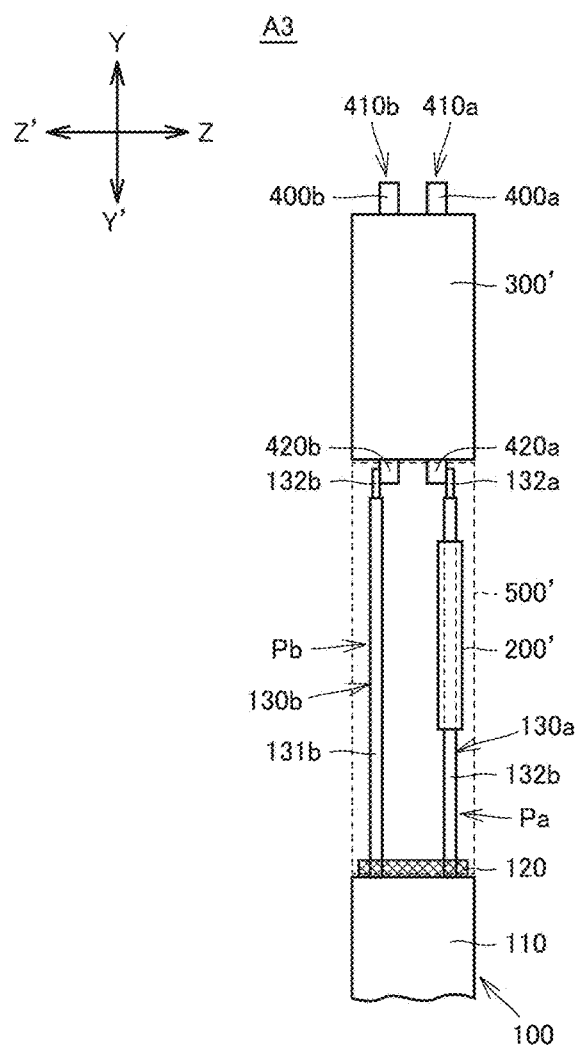
FIG. 6B is a schematic side view of the cable assembly, with the shield case shown as transparent.
Figure 7:
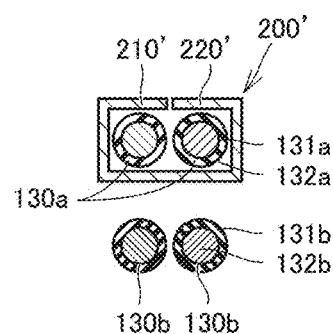
FIG. 7 is an end view of the cable assembly including an aspect of an electroconductive member, taken along line 7-7 in FIG. 6A.

A cable assembly A3 according to the third embodiment of the invention will be hereinafter described with reference to FIG. 6A through FIG. 7. The cable assembly A3 has the same configuration to that of the cable assembly A1, except the following differences. The first difference is that the body 300' has a different configuration from that of the body 300 of the first embodiment. The second difference is that the layout of the terminals 400b and the second wires 130b is different between the first and third embodiments. The third difference is that the electroconductive member 200 is replaced with the electroconductive member 200'. The fourth difference is that the shield case 500' has a different shape from that of the shield case 500 of the first embodiment. These differences will be solely described in detail, without repeating descriptions on the cable assembly A3 that overlap with those of the cable assembly A1. FIG. 6A shows the Y-Y' and X-X' directions in a similar manner to the assembly A1. FIG. 6B shows the Y-Y' and Z-Z' directions in a similar manner to the assembly A1.

As shown in FIG. 6A and FIG. 6B, the body 300' is a block of insulating resin. The body 300' is smaller in the X-X' direction than the body 300. The body 300' is larger in the Z-Z' direction than the body 300. In other words, the body 300' is elongated in the Y-Y' direction. The body 300' holds the terminals 400a with a clearance therebetween in the X-X' direction. The body 300' holds the terminals 400b with a clearance therebetween in the X-X' direction, on the Z'-direction side (one side in the third direction) relative to the terminal 400a. The terminals 400a and the terminals 400b may be insert-molded in the body 300' or securely press-fitted in holes or grooves in the body 300'.

The end portions of the core wires 132b of the protruding portions Pb of the second wires 130b are connected to the terminals 400b by soldering or other means. Accordingly, as shown in FIG. 6B and FIG. 7, the protruding portions Pb of the second wires 130b are located on the Z'-direction side (one side in the third direction) relative to the protruding portions Pa of the first wires 130a. FIG. 6A and FIG. 6B show only part of the cable 100.

The electroconductive member 200' is configured as described for the second embodiment. The shield case 500' has the same configuration as the shield case 500 of the first embodiment, except that the shield case 500' is a metal rectangular tube. FIG. 6A and FIG. 6B show the shield case 500' in dashed line for the convenience of explanation.

A method for manufacturing the cable assembly A3 configured as described above is substantially the same as the method for manufacturing the cable assembly A1. The differences are that the step of connecting the second wires 130b is different between the first and third embodiments, and that the steps of winding the electroconductive member 200' are different from that of the electroconductive member 200 of the first embodiment. Hereinafter solely described are the steps of connecting the second wires 130*b* and winding the electroconductive member 200'.

In the step of connecting the second wires 130*b* to the terminals 400*b*, the protruding core wires 132*b* of the protruding portions Pb of the second wires 130*b* of the cable 100 are connected to the respective terminals 400*b* by soldering or other means. The protruding portions Pb of the second wires 130*b* are thus located on the Z'-direction side relative to the protruding portions Pa of the first wires 130*a*.

The steps of winding the electroconductive member 200' (including the fixing step) is performed, in a similar manner to the second embodiment, before or after the steps of connecting the first wires 130*a* to the terminals 400*a* and the second wires 130*b* to the terminals 400*b*. In the winding steps, the protruding portions Pb of the second wires 130*b*, located on the Z'-direction side relative to the protruding portions Pa of the first wires 130*a*, is not likely to obstruct the winding of the electroconductive member 200'.

The cable assembly A3 and its manufacturing method described above provide technical features and effects similar to those of the cable assembly A2 and its manufacturing method.

The cable assembly and its manufacturing method described above are not limited to the embodiments described above but may be modified in any manner within the scope of the claims. The modifications will be hereinafter described in detail.

The first connecting member of the invention may be modified in any manner as long as it is electrically conductive and connectable to the core wires of the first wires of the embodiments described above or of the modifications described below. The second connecting member of the invention may be modified in any manner as long as it is electrically conductive and connectable to the core wire of the second wire of the embodiments described above or of the modifications described below.

Figure 8:
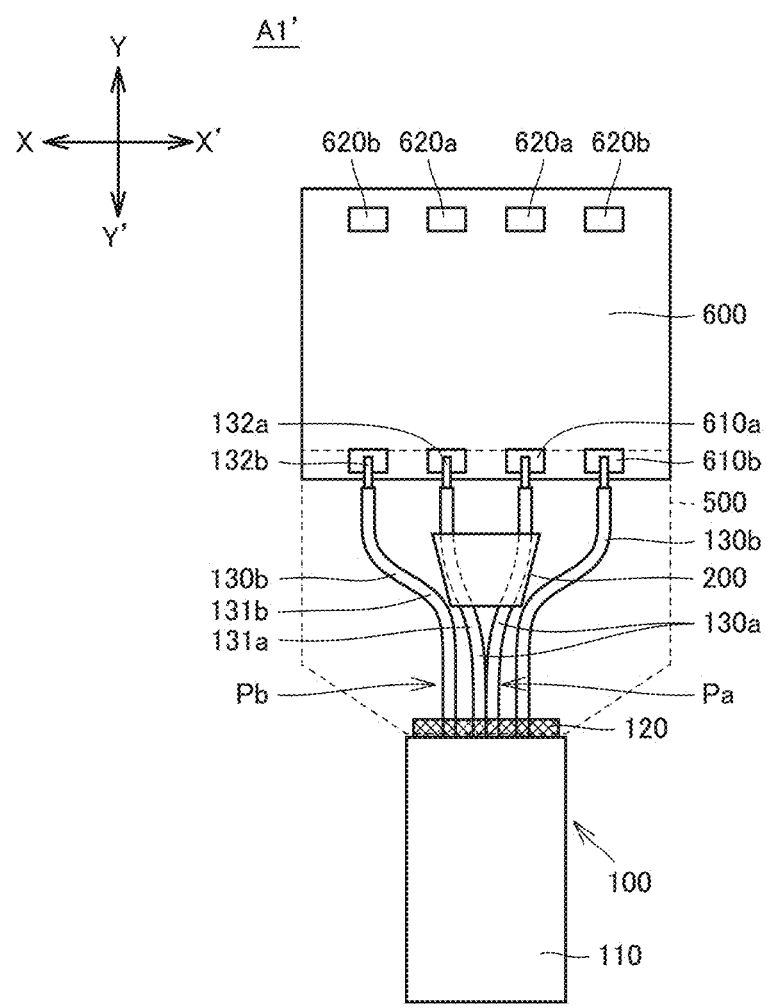
FIG. 8 is a schematic plan view of a cable assembly according to a first modification of the first embodiment, with the shield case shown as transparent.

For example, the body 300, the terminals 400*a*, and the terminals 400*b* may be replaced with a circuit board 600 as in a cable assembly A1' as shown in FIG. 8. The cable assembly A1' has the same configuration as the cable assembly A1, except that the body 300, the terminal 400*a* and the terminal 400*b* are replaced with the circuit board 600. On the Z-direction-side face of the circuit board 600, there are arranged electrodes 610*b*, 610*a*, 610*a*, 610*b*, in this order, in the X-X' direction with intervals therebetween. The electrodes 610*a* are respectively connected to the protruding core wires 132*a* of the protruding portions Pa of the first wires 130*a*. The electrodes 610*b* are respectively connected to the protruding core wires 132*b* of the protruding portions Pb of the second wires 130*b*. Each electrode 610*a* corresponds to the first connecting member described above, and each electrode 610*b* corresponds to the second connecting member described above. Also in the cable assembly A2, the circuit board 600 may be provided in place of the body 300, the terminal 400*a* and the terminal 400*b*. In FIG. 8, the electrodes 620*a* are arranged on the Z-direction-side face of the circuit board 600 and contactable with signal transmission terminals of a connection target as described above, and the electrodes 620*b* are arranged on the Z-direction-side face of the circuit board 600 and contactable with other terminals of the connection target. The electrodes 610*a* are connected to the electrodes 620*a* via electroconductive lines (not shown) in the circuit board 600. The electrodes 610*b* are connected to the electrode 620*b* via electroconductive lines (not shown) in the circuit board 600.

Figure 9:
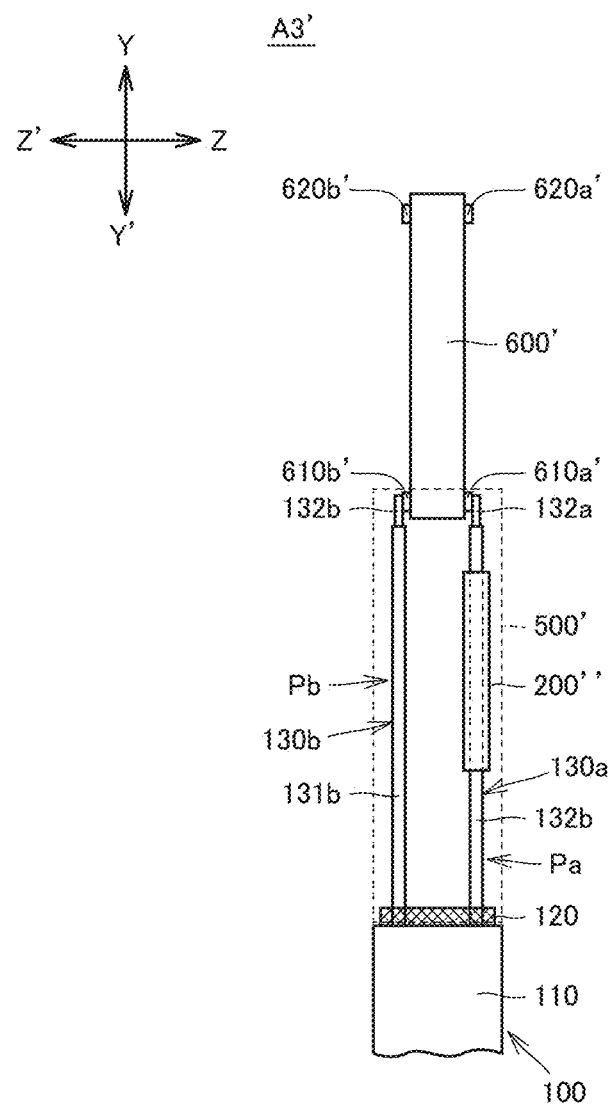
FIG. 9 is a schematic plan view of a cable assembly according to a first modification of the third embodiment, with the shield case shown as transparent.

Also, the body 300', the terminal 400*a*, and the terminal 400*b* may be replaced with a circuit board 600' as in a cable assembly A3' as shown in FIG. 9. The cable assembly A3' has the same configuration as the cable assembly A3, except that the body 300', the terminal 400*a* and the terminal 400*b* are replaced with the circuit board 600'. On the Z-direction-side face of the circuit board 600', there are arranged electrodes 610*a*' in the X-X' direction with an interval therebetween. On the Z'-direction-side face of the circuit board 600', there are arranged electrodes 610*b*' in the X-X' direction with an interval therebetween. The electrodes 610*a*' are respectively connected to the protruding core wires 132*a* of the protruding portions Pa of the first wires 130*a*. The electrodes 610*b*' are respectively connected to the protruding core wires 132*b* of the protruding portions Pb of the second wires 130*b*. Each electrode 610*a*' corresponds to the first connecting member described above, and each electrode 610*b*' corresponds to the second connecting member described above. In FIG. 9, the electrodes 620*a*' are arranged on the Z-direction-side face of the circuit board 600' and contactable with signal transmission terminals of a connection target as described above, and the electrodes 620*b*' are arranged on the Z'-direction-side face of the circuit board 600' and contactable with other terminals of the connection target. The electrodes 610*a*' are connected to the electrodes 620*a*' via electroconductive lines (not shown) in the circuit board 600'. The electrodes 610*b*' are connected to the electrode 620*b*' via electroconductive lines (not shown) in the circuit board 600'.

The contact portion of each terminal of any aspect described above may not protrude from the body but may be housed in a groove or hole in the body. In this case, the contact portion of each terminal is to be brought into contact with each terminal of a mating connector received in the groove or the hole of the body. It is should be noted that there is provided at least one first connecting member of any aspect described above and at least one second connecting member of any aspect described above. The at least one second connecting member may be omitted.

The cable of the invention includes at least one first wire, which may be modified in any manner as long it is a signal wire inside the outer insulator and the shield conductor of the cable and includes a protruding portion protruding substantially in the first direction from the outer insulator and the shield conductor, with the core wire of the protruding portion connected to the first connecting member of any aspect described above. The first direction is the longitudinal direction of the cable. The first wire of the cable of the invention may be configured for transmission of signals other than differential signals.

Figure 10:
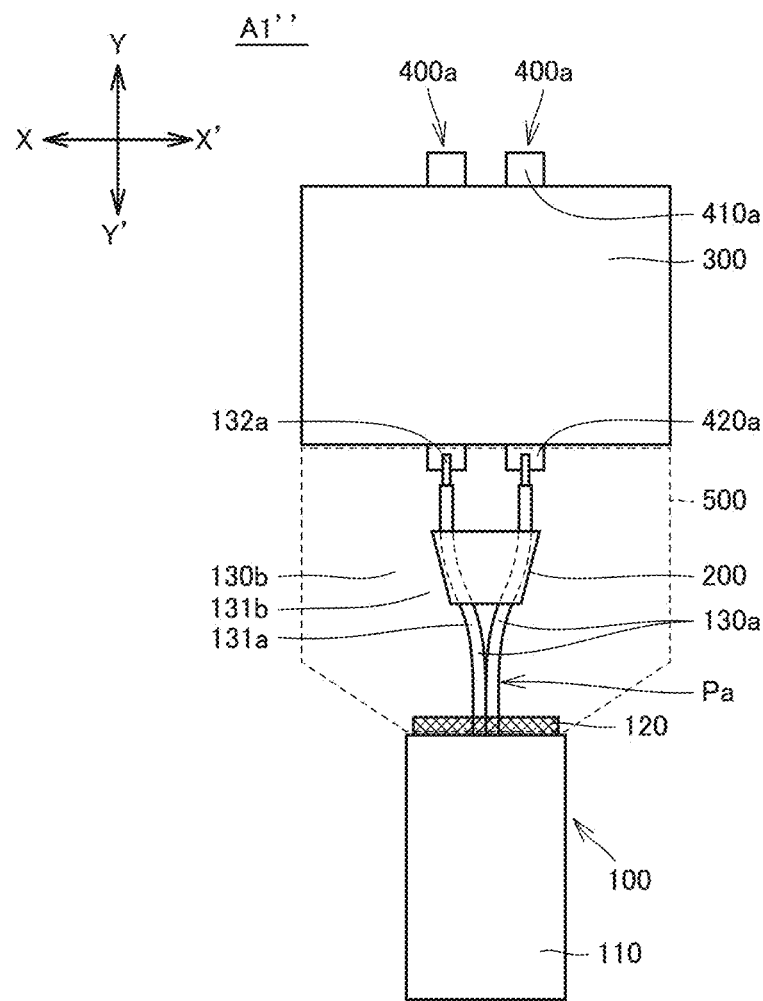
FIG. 10 is a schematic plan view of a cable assembly according to a second modification of the first embodiment, with the shield case shown as transparent.
Figure 11:
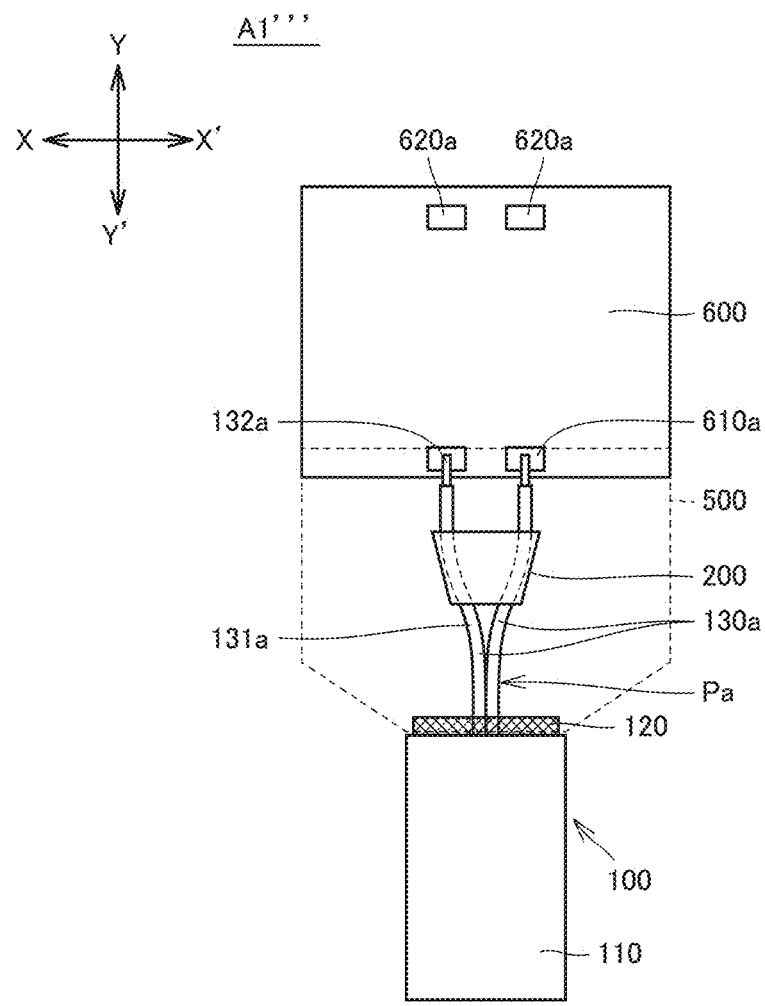
FIG. 11 is a schematic plan view of a cable assembly according to a third modification of the first embodiment, with the shield case shown as transparent.

The cable of the invention may include at least one second wire, which may be modified in any manner as long it is a wire other than a signal wire, disposed inside the outer insulator and the shield conductor of the cable and includes the protruding portion protruding substantially in the first direction from the outer insulator and the shield conductor, with the core wire of the protruding portion connected to the second connecting member of any aspect described above. The at least one second wire of the cable of the invention may be omitted. For example, the at least one second wire and the terminal connected thereto may be omitted as in a cable assembly A1" shown in FIG. 10. Except this omission, the cable assembly A1" has the same configuration as the cable assembly A1. The cable assemblies A2 and A3 may also be so modified to omit the second wire and the terminal connected thereto. The second wire and the electrode connected thereto are omitted also in a cable assembly A1''' as shown in FIG. 11. The second wire and the electrode connected thereto may be omitted also in the cable assembly A2 including the circuit board 600 in place of the body 300, the terminal 400a and the terminal 400b, and in the cable assembly A3'.

The electroconductive member of the invention may be modified in any manner as long as it is an electroconductive plate or electroconductive tape wound around the at least a part in the first direction of the protruding portion of the first wire of any aspect described above. For example, the electroconductive member may cover the inner insulator in entirety in the first direction of the protruding portion of the first wire. The electroconductive member may be wound around the at least parts of the protruding portions of a pair of first wires such that the distance in the second direction between the parts of the protruding portions of the first wires is smaller than the distance in the second direction between the first connecting members. The second direction crosses the first direction. The electroconductive tape or electroconductive plate of any aspect described above may be wound around the at least the part(s) in the first direction of the protruding portion(s) of the first wire(s) of any embodiment described above such that the first and second end portions of the electroconductive tape or electroconductive plate face each other with a clearance therebetween. The electroconductive plate or electroconductive tape of any aspect described above may be wound around the at least part(s) in the first direction of the protruding portion(s) of the first wire(s) of any embodiment described above described above such that one of the first and second end portions of the electroconductive plate or electroconductive tape is in contact with the electroconductive plate or electroconductive tape. For example, the electroconductive plate or electroconductive tape of any aspect described above may be wound around the at least part(s) in the first direction of the protruding portion(s) of the first wire(s) of any aspect described above such that the first and second end portions of the electroconductive plate or electroconductive tape are in contact with each other at their distal ends. The electroconductive plate or electroconductive tape of any aspect described above may be wound in a plurality of turns around the at least part(s) in the first direction of the protruding portion(s) of the first wire(s) of any aspect described above, so that the first end portion of the electroconductive plate or electroconductive tape is in contact with the electroconductive plate or electroconductive tape from inside, and the second end portion, opposite to the first end portion, of the electroconductive plate or electroconductive tape is in contact with the electroconductive plate or electroconductive tape from outside. The electroconductive member of any aspect described above may be wound around the at least parts in the first direction of the protruding portions of the first and second wires of any aspect described above. The electroconductive member of any aspect described above, similarly to the embodiments described above, may be fixed to the at least part(s) in the first direction of the protruding portion(s) of the first wire(s) of any embodiment described above. The swaging of the electroconductive member of any aspect described above may be performed by deforming at least a portion of the electroconductive member is to the inside and fixing the portion to the at least part(s) in the first direction of the protruding portion(s) of the first wire(s) of any aspect described above.

The shield case of the invention may be modified in any manner as long as it is configured to at least cover the protruding portion(s) of the first wire(s), the electroconductive member, and the or each connection point at which the or each core wire of the protruding portion is connected to the or each first connecting member. For example, the shield case of the invention may configured to cover, in addition to the protruding portion(s) of the first wire(s), the electroconductive member, and the or each connection point at which the or each core wire of the protruding portion is connected to the or each first connecting member, at least part of the body or at least part the circuit board. The shield case of any aspect described above may be an insulating resin tube having an inner surface with a deposited metal film or the like. The shield case of any aspect described above may be shaped generally like a half tube covering the protruding portion(s) of the first wire(s), the electroconductive member, and the or each connection point at which the or each core wire of the protruding portion is connected to the or each first connecting member, from one of sides in the third direction crossing the first direction and the second direction. The shield case of the invention may be omitted.

In a plastic molding there may be insert-molded the protruding portion(s) of the first wire(s), the electroconductive member, and the or each connection point at which the or each core wire of the protruding portion is connected to the or each first connecting member. The plastic molding may hold the body or the circuit board. In either case, the shield case may be omitted. The shield case of the invention may be configured to cover the plastic molding in order to at least cover the protruding portion(s) of the first wire(s), the electroconductive member, and the or each connection point at which the or each core wire of the protruding portion is connected to the or each first connecting member.

The method for manufacturing the cable assembly of the invention may be modified in any manner as long as the method includes cutting away the end portion of the outer insulator and the end portion of the shield conductor inside the outer insulator of the cable so as to protrude the end portion of the at least one first wire in the first direction from the shield conductor and the outer insulator, wherein the first direction being the longitudinal direction of the cable, winding the electroconductive plate or electroconductive tape around the at least part of the end portion of the first wire, and connecting the core wire of the end portion of the first wire to the terminal or to the electrode of the circuit board before or after winding the electroconductive plate or electroconductive tape.

In cases in which the body and the terminal are replaced with the circuit board as described above, it is preferable that the core wire of the protruding portion of the or each first wire is connected to an associated electrode (e.g. the electrodes 610a, 610a') of the circuit board and the core wire of the protruding portion of the or each second wire is connected to another electrode (for example, the electrodes 610b, 610b') of the circuit board.

The step of winding the electroconductive member of any aspect described above may include winding the electroconductive member around at least parts of the first and second wires.

It should be appreciated that the materials, shapes, dimensions, numbers, arrangements, and other configurations of the constituents of the cable assembly of the above embodiments and variants are described above by way of examples only and may be modified in any manner if they can perform similar functions. The configurations of the embodiments and the variants described above may be combined in any possible manner. The first direction of the invention may be defined in any manner as long as it is to the longitudinal direction of the cable. The second direction of the invention may be defined in any manner as long as it crosses the first direction. The third direction of the invention may be defined in any manner as long as it crosses the first and second directions and does not exist on the same plane formed by the first direction and the second direction.

REFERENCE SIGNS LIST

A1: cable assembly
100: cable
110: outer insulator
120: shield conductor
130a: first wire
131a: inner insulator
132a: core wire
Pa: protruding portion
130b: second wire
131b: inner insulator
132b: core wire
Pb: protruding portion
200: electroconductive member
210: first end portion
220: second end portion
300: body
400a: terminal (first connecting member)
410a: contact portion
420a: tail
400b: terminal (second connecting member)
410b: contact portion
420b: tail
500: shield case
A2: cable assembly
100: cable
110: outer insulator
120: shield conductor
130a: first wire
131a: inner insulator
132a: core wire
Pa: protruding portion
130b: second wire
131b: inner insulator
132b: core wire
Pb: protruding portion
200': electroconductive member
210': first end portion
220': second end portion
300: body
400a: terminal (first connecting member)
410a: contact portion
420a: tail
400b: terminal (second connecting member)
410b: contact portion
420b: tail
500: shield case
A3: cable assembly
100: cable
110: outer insulator
120: shield conductor
130a: first wire
131a: inner insulator
132a: core wire
Pa: protruding portion
130b: second wire
131b: inner insulator
132b: core wire
Pb: protruding portion 200': electroconductive member
210': first end portion
220': second end portion
300': body
400a: terminal (first connecting member)
410a: contact portion
420a: tail
400b: terminal (second connecting member)
410b: contact portion
420b: tail
500': shield case

What is claimed is:

1. A cable assembly comprising:
a first connecting member having electrical conductivity;
a cable;
an electroconductive plate; and
a shield case, wherein
the cable includes:
an outer insulator,
a shield conductor disposed inside the outer insulator, and
at least one first wire inside the shield conductor, the at least one first wire being a signal wire,
the or each first wire includes a protruding portion,
the protruding portion protrudes substantially in a first direction from the shield conductor and the outer insulator, and a core wire of the protruding portion is connected to the first connecting member, the first direction being a longitudinal direction of the cable,
the electroconductive plate is separate from the first connecting member and is wound around at least a part, in the first direction, of the protruding portion, and
the shield case is a separate member from the electroconductive plate and at least covers the protruding portion of the at least one first wire, the electroconductive plate, and a connection point at which the core wire of the protruding portion is connected to the first connecting member.

2. The cable assembly according to claim 1, wherein
the first connecting member comprises a pair of the first connecting members,
the first wire of the cable comprises a pair of first wires, and
the electroconductive plate is wound around at least the parts of the protruding portions of the first wires.

3. The cable assembly according to claim 2, wherein
the first connecting members are spaced apart from each other in a second direction, the second direction crossing the first direction,
the first wires are configured to transmit a differential signal, and
the electroconductive plate is wound around at least the parts of the protruding portions of the first wires such that a distance in the second direction between the parts of the protruding portions of the first wires is smaller than a distance in the second direction between the first connecting members.

4. The cable assembly according to claim 1, wherein
the electroconductive plate includes a first end portion and a second end portion opposite to the first end portion, and
the electroconductive plate is wound around the at least part of the protruding portion such that at least one of the first and second end portions is in contact with the electroconductive plate.

5. The cable assembly according to claim 1, wherein
the electroconductive plate includes a first end portion and a second end portion opposite to the first end portion, and
the electroconductive plate is wound around the at least part of the protruding portion such that the first end portion and the second end portion face each other with a clearance therebetween.

6. The cable assembly according to claim 1, wherein the electroconductive plate is electrically connected to the shield conductor of the cable.

7. The cable assembly according to claim 1,
wherein the electroconductive plate is electrically connected to the shield case.

8. The cable assembly according to claim 2, further comprising a second connecting member having electrical conductivity,
wherein the cable further includes a second wire inside the shield conductor, the second wire being other than a signal wire and including a protruding portion,
the protruding portion of the second wire protrudes in the first direction from the shield conductor and the outer insulator, and a core wire of the protruding portion of the second wire is connected to the second connecting member, and
the electroconductive plate is wound only around the at least parts of the protruding portions of the first wires.

9. The cable assembly according to claim 2, wherein the first connecting members are spaced apart from each other in a second direction crossing the first direction,
the cable assembly further includes a second connecting member having electrical conductivity, the second connecting member being disposed on one side in a third direction relative to the first connecting members, the third direction crossing the first and second directions,
the cable further includes a second wire inside the shield conductor, the second wire not being a signal wire and including a protruding portion,
the protruding portion of the second wire protrudes in the first direction from the shield conductor and the outer insulator, and a core wire of the protruding portion of the second wire is connected to the second connecting member,
the protruding portion of the second wire is disposed on the one side in the third direction relative to the protruding portions of the first wires, and
the electroconductive plate is wound only around the at least part of the protruding portion of the pair of first wires.

10. The cable assembly according to claim 8, further comprising an insulating body holding the first and second connecting members,
wherein the first and second connecting members are terminals.

11. The cable assembly according to claim 8, further comprising a circuit board,
wherein the first and second connecting members are electrodes on the circuit board.

12. A method for manufacturing the cable assembly according to claim 1, the method comprising:
preparing a cable with an end portion of an outer insulator and an end portion of a shield conductor inside the outer insulator of a cable cut away so as to protrude an end portion of a first wire in a first direction from the shield conductor and the outer insulator, the first wire being a signal wire, the first direction being a longitudinal direction of the cable;
connecting a core wire of the end portion of the first wire to a terminal or to an electrode of a circuit board; and
winding an electroconductive plate around at least a part in the first direction of the end portion of the first wire before or after the connection of the core wire of the first wire.

13. The method for manufacturing the cable assembly according to claim 12, wherein
the first wire comprises a pair of first wires,
the terminal or the electrode of the circuit board comprises a pair of the terminals or a pair of the electrodes of the circuit board,
the connection of the core wire of the first wire includes connecting the core wires of the end portions of the first wires respectively to the terminals or to the electrodes of the circuit board, and
the winding of the electroconductive plate includes winding the electroconductive plate around the at least parts of the end portions of the first wires.

14. The method for manufacturing the cable assembly according to claim 13, wherein
the terminals or the electrodes of the circuit board are spaced apart from each other in a second direction, the second direction crossing the first direction, and
the winding of the electroconductive plate includes winding the electroconductive plate around the at least parts of the end portions of the first wires such that a distance in the second direction between the parts of the end portions of the first wires is smaller than a distance in the second direction between the terminals or electrodes.

15. The method for manufacturing the cable assembly according to claim 12, wherein
the electroconductive plate includes a first end portion and a second end portion opposite to the first end portion, and
the winding of the electroconductive plate includes winding the electroconductive plate around the at least part of the end portion of the first wire such that at least one of the first end portion and the second end portion is in contact with the electroconductive plate.

16. The method for manufacturing the cable assembly according to claim 12, wherein
the electroconductive plate includes a first end portion and a second end portion opposite to the first end portion, and
the winding of the electroconductive plate includes winding the electroconductive plate around the at least part of the end portion of the first wire such that the first end portion and the second end portion face each other with a clearance therebetween.

17. The cable assembly according to claim 1, wherein the electroconductive plate is partly swaged inward such that the electroconductive plate is fixed to the part of the protruding portion of the first wire.

18. The cable assembly according to claim 4, wherein the first and second end portions of the electroconductive plate are swaged inward such that the electroconductive plate is fixed to the part of the protruding portion of the first wire.

19. The cable assembly according to claim 5, wherein the first and second end portions of the electroconductive plate are swaged inward such that the electroconductive plate is fixed to the part of the protruding portion of the first wire.

20. The cable assembly according to claim 1, wherein the at least a part in the first direction comprises a length of the protruding portion, the electroconductive plate covers opposite sides of the length in a second direction, the electroconductive plate covers opposite sides of the length in a third direction, the second direction orthogonally crosses the first direction, and the third direction orthogonally crosses the first and second directions.

21. The cable assembly according to claim 1, wherein the or each first wire includes an inner insulator inside the shield conductor and a core wire inside the inner insulator, the protruding portion of the or each first wire includes:

a first protruding portion of the inner insulator, the first protruding portion protruding substantially in the first direction from the shield conductor and the outer insulator, and a second protruding portion of the core wire, the second protruding portion protruding substantially in the first direction from the first protruding portion of the inner insulator, the second protruding portion being said core wire of the protruding portion, and the electroconductive member is wound around the at least part of the first protruding portion of the inner insulator of the at least one first wire.

22. The cable assembly according to claim 1, wherein the electroconductive member is not in contact with the first connecting member.

* * * * *